(12) United States Patent
Chen et al.

(10) Patent No.: US 11,546,417 B2
(45) Date of Patent: Jan. 3, 2023

(54) METHOD FOR MANAGING ARTIFICIAL INTELLIGENCE APPLICATION, DEVICE, AND PROGRAM PRODUCT

(71) Applicant: EMC IP Holding Company LLC, Hopkinton, MA (US)

(72) Inventors: Qiang Chen, Shanghai (CN); Jiacheng Ni, Shanghai (CN); Jinpeng Liu, Shanghai (CN); Zhen Jia, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 17/067,908

(22) Filed: Oct. 12, 2020

(65) Prior Publication Data

US 2022/0086217 A1 Mar. 17, 2022

(30) Foreign Application Priority Data

Sep. 16, 2020 (CN) .......................... 202010973307.5

(51) Int. Cl.
*H04L 67/10* (2022.01)
*G06N 20/00* (2019.01)
*H03M 7/30* (2006.01)

(52) U.S. Cl.
CPC .............. *H04L 67/10* (2013.01); *G06N 20/00* (2019.01); *H03M 7/30* (2013.01)

(58) Field of Classification Search
CPC ......... H04L 67/10; H04L 67/34; G06N 20/00; H03M 7/30; H03M 7/3059
See application file for complete search history.

(56) References Cited

U.S. PATENT DOCUMENTS

| 8,554,703 | B1 * | 10/2013 | Lin | ........................ | G06N 20/00 706/12 |
| 10,268,749 | B1 * | 4/2019 | Roy | ..................... | G06F 16/2246 |
| 10,698,766 | B2 * | 6/2020 | Zhao | ...................... | G06F 9/4881 |

(Continued)

OTHER PUBLICATIONS

K. Zhang et al., "Machine Learning-Based Temperature Prediction for Runtime Thermal Management Across System Components," IEEE Transactions on Parallel and Distributed Systems, Feb. 1, 2018, pp. 405-419, vol. 29, No. 2.

(Continued)

*Primary Examiner* — Michael Won
(74) *Attorney, Agent, or Firm* — Ryan, Mason & Lewis, LLP

(57) ABSTRACT

The present disclosure relates to a method for managing an artificial intelligence (AI) application, a device, and a program product. One method comprises receiving input data to be processed by the AI application; updating a first version of the AI application with the input data to generate a second version, wherein the first version is deployed at server equipment; compressing the second version of the AI application to generate a third version of the AI application; and deploying the third version of the AI application to terminal equipment to replace a fourth version of the AI application deployed at the terminal equipment, wherein the fourth version of the AI application is used for processing the input data received at the terminal equipment. A device and a computer program product corresponding thereto are provided.

20 Claims, 9 Drawing Sheets

(56) References Cited

U.S. PATENT DOCUMENTS

| | | | |
|---|---|---|---|
| 10,893,097 B1* | 1/2021 | Liu | G06F 11/3419 |
| 2008/0134347 A1* | 6/2008 | Goyal | G06F 21/6209 |
| | | | 726/29 |
| 2010/0153785 A1* | 6/2010 | Keromytis | G06F 11/08 |
| | | | 714/38.11 |
| 2010/0235552 A1* | 9/2010 | Holden | H04M 1/72412 |
| | | | 710/72 |
| 2010/0262579 A1* | 10/2010 | Brown | H04W 60/04 |
| | | | 707/609 |
| 2012/0284212 A1* | 11/2012 | Lin | G06N 20/00 |
| | | | 706/12 |
| 2012/0284213 A1* | 11/2012 | Lin | G06N 3/08 |
| | | | 706/12 |
| 2015/0128249 A1* | 5/2015 | Alexandrian | G06F 21/629 |
| | | | 726/16 |
| 2017/0124487 A1* | 5/2017 | Szeto | G06F 11/1448 |
| 2017/0357910 A1* | 12/2017 | Sommer | G06N 20/00 |
| 2018/0285086 A1* | 10/2018 | O'Malley | G06F 8/65 |
| 2018/0300653 A1* | 10/2018 | Srinivasan | H04L 67/06 |
| 2019/0228261 A1* | 7/2019 | Chan | G06F 8/36 |
| 2019/0385043 A1* | 12/2019 | Choudhary | G06N 3/0454 |
| 2020/0110591 A1* | 4/2020 | Buczkowski | G06F 8/62 |
| 2020/0249936 A1* | 8/2020 | Barfield, Jr. | G06F 8/433 |
| 2021/0035021 A1* | 2/2021 | Sasson | G06N 3/08 |
| 2021/0117859 A1* | 4/2021 | Rogers | H04L 41/0836 |
| 2021/0344559 A1* | 11/2021 | Kabbinale | H04L 41/0873 |
| 2021/0392049 A1* | 12/2021 | Jeuk | H04L 47/74 |
| 2021/0405984 A1* | 12/2021 | Agarwal | G06F 8/71 |
| 2022/0156633 A1* | 5/2022 | Anwar | G06N 20/00 |

OTHER PUBLICATIONS

Z. Liu et al., "Learning Efficient Convolutional Networks through Network Slimming," arXiv:1708.06519v1 [cs.CV], Aug. 22, 2017, 10 pages.

S. Ahmad et al., "Unsupervised Real-Time Anomaly Detection for Streaming Data," Neurocomputing, Apr. 22, 2017, pp. 134-147.

spark.apache.org, "Clustering—RDD-Based API," http://spark.apache.org/docs/latest/mllib-clustering.html, downloaded Jun. 27, 2019, 20 pages.

U.S. Appl. No. 16/536,599 filed in the name of Zhenzhen Lin et al. filed Aug. 9, 2019, and entitled "Method, Device and Computer Program Product for Data Analysis."

U.S. Appl. No. 16/805,065 filed in the name of Ruixue Zhang et al. filed Feb. 28, 2020, and entitled "Methods, Devices, and Computer Program Products for Model Adaptation."

U.S. Appl. No. 16/824,834 filed in the name of Wenbin Yang et al. filed Mar. 20, 2020, and entitled "Method, Device, and Program Product for Determining Model Compression Rate."

\* cited by examiner

US 11,546,417 B2

METHOD FOR MANAGING ARTIFICIAL INTELLIGENCE APPLICATION, DEVICE, AND PROGRAM PRODUCT

RELATED APPLICATION(S)

The present application claims priority to Chinese Patent Application No. 202010973307.5, filed Sep. 16, 2020, and entitled "Method for Managing Artificial Intelligence Application, Device, and Program Product," which is incorporated by reference herein in its entirety.

FIELD

Implementations of the present disclosure relate to artificial intelligence (AI), and more particularly, relate to a method for managing an AI application at server equipment and terminal equipment, a device, and a computer program product.

BACKGROUND

As AI technology continues to develop, it is increasingly being deployed in many fields impacting people's lives. For example, an AI application for processing sports data may be deployed at terminal equipment (e.g., a smart phone) to determine steps and tracks of a user carrying the terminal equipment. For another example, an AI application for processing images may be deployed at the terminal equipment to remove dithering, noise, etc. in images captured by the smart phone. It will be understood that there are limitations in storage capacity and computing power of the terminal equipment. And now, how to maintain and update the AI application at the terminal equipment in time has become an important area of research.

SUMMARY

Therefore, it is expected that a technical solution for managing AI applications in a more effective way can be developed and implemented. The technical solution is expected to be capable of maintaining and updating the AI applications in a more convenient and effective way.

In accordance with a first aspect of the present disclosure, a method for managing an AI application is provided. The method includes receiving input data to be processed by the AI application; updating a first version of the AI application with the input data to generate a second version of the AI application, wherein the first version of the AI application is deployed at server equipment; compressing the second version of the AI application to generate a third version of the AI application; and deploying the third version of the AI application to terminal equipment to replace a fourth version of the AI application deployed at the terminal equipment, wherein the fourth version of the AI application is used for processing the input data received at the terminal equipment.

In accordance with a second aspect of the present disclosure, an electronic device is provided, including: at least one processor, a volatile memory, and a memory coupled with the at least one processor, wherein the memory has instructions stored therein, and the instructions, when executed by the at least one processor, cause the device to execute the method in accordance with the first aspect of the present disclosure.

In accordance with a third aspect of the present disclosure, a computer program product is provided. The computer program product is tangibly stored on a non-transitory computer-readable medium and includes machine executable instructions which are used for executing the method in accordance with the first aspect of the present disclosure.

In accordance with a fourth aspect of the present disclosure, a method for managing an AI application is provided. The method includes processing input data with a fourth version of the AI application deployed at terminal equipment to provide output data; transmitting the input data to server equipment deployed with a first version of the AI application to update the first version of the AI application to a second version of the AI application with the input data; receiving a third version of the AI application from the server equipment, wherein the third version of the AI application is acquired based on compressing the second version of the AI application; and deploying the third version of the AI application to the terminal equipment to replace the fourth version of the AI application.

In accordance with a fifth aspect of the present disclosure, an electronic device is provided, including at least one processor, a volatile memory, and a memory coupled with the at least one processor, wherein the memory has instructions stored therein, and the instructions, when executed by the at least one processor, cause the device to execute the method in accordance with the fourth aspect of the present disclosure.

In accordance with a sixth aspect of the present disclosure, a computer program product is provided. The computer program product is tangibly stored on a non-transitory computer-readable medium and includes machine executable instructions which are used for executing the method in accordance with the fourth aspect of the present disclosure.

BRIEF DESCRIPTION OF THE DRAWINGS

The features, advantages, and other aspects of respective implementations of the present disclosure will become more apparent from the following detailed description and in conjunction with the accompanying drawings. Certain implementations of the present disclosure are shown herein by way of example and not limitation. In the accompanying drawings.

DETAILED DESCRIPTION

Hereinafter, illustrative embodiments of the present disclosure will be described in more detail with reference to the accompanying drawings. Although illustrative embodiments of the present disclosure are shown in the accompanying drawings, it should be understood that the present disclosure may be implemented in various forms and should not be limited by the implementations set forth herein. Rather, these implementations are provided so that the present disclosure will be more thorough and complete, and the scope of the present disclosure can be fully conveyed to those skilled in the art.

As used herein, the term "include" and variations thereof mean open-ended inclusion, that is, "including but not limited to." Unless specifically stated, the term "or" indicates "and/or." The term "based on" means "based at least in part on." The terms "one example implementation" and "one implementation" mean "at least one example implementation." The term "another implementation" means "at least one further implementation." The terms "first," "second," etc. may refer to different or the same objects. Other explicit and implicit definitions may also be included below.

In order to facilitate description, a pedometer application deployed on terminal equipment will be described as an example of an AI application hereinafter. Assuming that the pedometer application may process walking data of a user; however, there is a large deviation in an output result of the pedometer application when the user begins to run. At this time, a version of the pedometer application should be updated.

Due to low computing power and storage capacity of terminal equipment, the sizes of AI applications applied to terminal equipment are generally small. Methods for deploying AI applications to terminal equipment have been provided at present. For example, trained models may be acquired based on methods of a decision tree, a logistic regression, etc. Then, the trained models may be rewritten using the C programming language or other programming languages, and a final target program may be deployed to terminal equipment. For another example, trained models may be acquired by server equipment provided with a graphics processing unit (GPU). Then, the models may be converted into small-sized AI applications by methods of artificial compression, pruning, etc. However, the methods all involve a relatively long development cycle, which causes time for updating versions of the AI applications on terminal equipment to be too long. Hence, a user has to spend a long time to wait for version updates.

Figure 1:
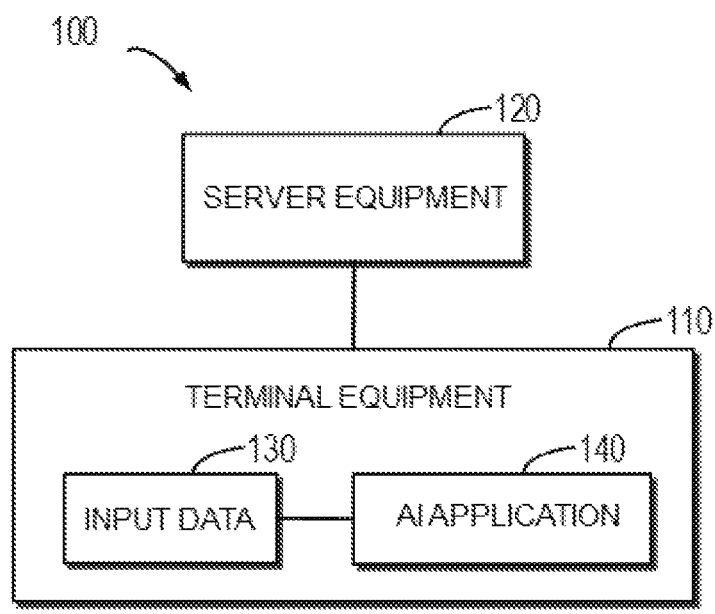
FIG. 1 schematically illustrates a block diagram of an application environment in which example implementations of the present disclosure may be implemented.

In order to overcome the above defect, an implementation of the present disclosure provides a technical solution for managing an AI application. Firstly, an application environment according to the example implementation of the present disclosure is described with reference to FIG. 1. FIG. 1 schematically illustrates block diagram 100 of an application environment in which an example implementation of the present disclosure may be implemented. As illustrated in FIG. 1, terminal equipment 110, may be, for example, a smart phone or a smart bracelet. AI application 140 (e.g., a pedometer application) may be operated on terminal equipment 110. When a user carries terminal equipment 110 and moves, a motion sensor of terminal equipment 110 will acquire input data 130. AI application 140 may process input data 130 and generate output data such as steps and tracks.

According to the example implementation of the present disclosure, server equipment 120 may monitor input data 130 in real time and determine whether AI application 140 needs to be updated or not. An existing AI application may be updated with input data 130 according to a determination that it needs to be updated. Specifically, assuming that AI application 140 is developed for processing walking data, AI application 140 will not correctly detect steps, tracks, etc. when the user begins to run. At this time, by monitoring input data 130 and operation states of AI application 140 in real time, an update request may be discovered rapidly, so that updating may be executed to further provide the AI application which can process running data.

Figure 2:
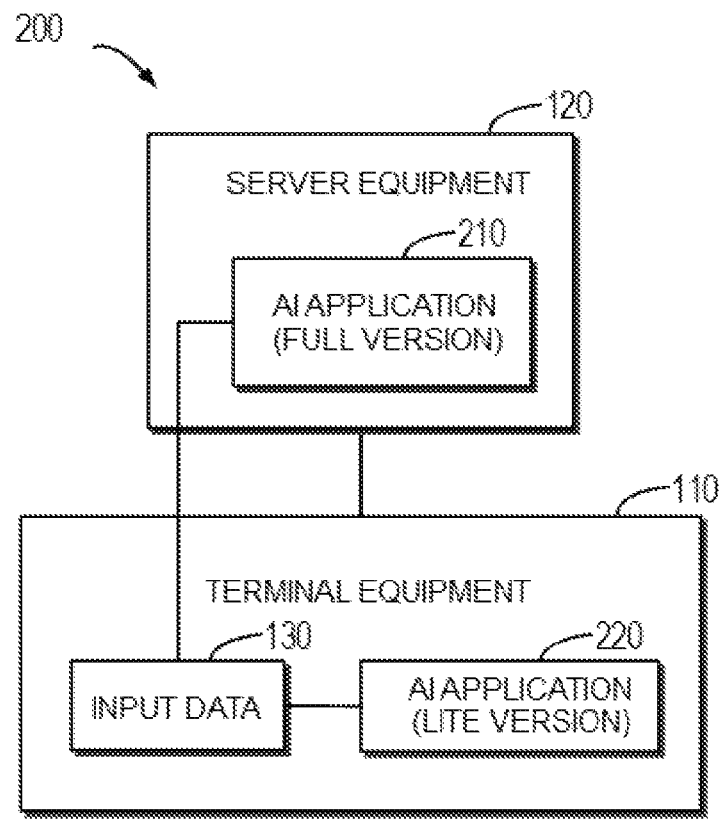
FIG. 2 schematically illustrates a block diagram of a process of managing an AI application according to an example implementation of the present disclosure.

Hereinafter, more details of the present disclosure will be described with reference to FIG. 2. FIG. 2 schematically illustrates block diagram 200 of a process of managing an AI application according to an example implementation of the present disclosure. As illustrated in FIG. 2, different versions may be provided to server equipment 120 and terminal equipment 110, respectively, i.e., a full version of AI application 210 and a lite version of AI application 220. Here, the full version of AI application 210 is operated at a server side and may process various complicated input data, while the lite version of AI application 220 is operated at a terminal side and may process relatively simple input data.

When it is found that the lite version of AI application 220 cannot process input data 130 correctly, the full version of AI application 210 may be updated based on input data 130. Then, the updated full version may be compressed to acquire an updated lite version. Further, the updated lite version may be used for replacing AI application 220 at terminal equipment 110. A full version of the AI application is deployed at the server equipment while a lite version is deployed at the terminal equipment side, and the lite version may be updated rapidly along with feature changes of the input data, thereby avoiding performance degradation of the AI application caused by changes of input features. Through the example implementation of the present disclosure, AI application 220 may be updated in real time, thereby improving accuracy and performance of other aspects of the AI application.

Figure 3:
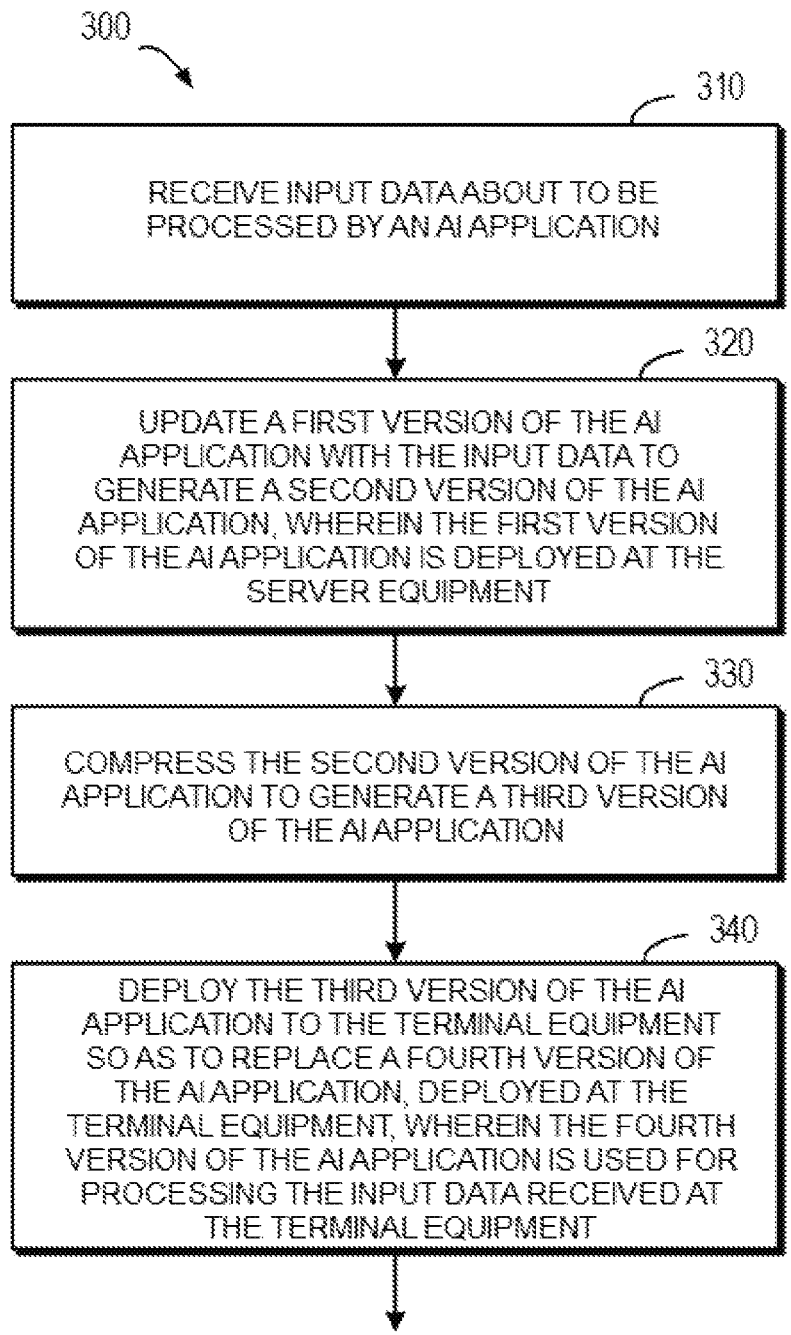
FIG. 3 schematically illustrates a flow chart of a method for managing an AI application according to an example implementation of the present disclosure.

Hereinafter, more details of an example implementation according to the present disclosure will be described with reference to FIG. 3. FIG. 3 schematically illustrates a flow chart of method 300 for managing an AI application according to an example implementation of the present disclosure. Method 300 may be implemented at server equipment 120. Input data 130 to be processed by the AI application is received at block 310. Input data 130 may be collected from a sensor at terminal equipment 110. For example, input data 130 may be received in real time. In this way, input data 130 and the operation state of AI application 220 may be monitored continuously.

Alternatively and/or additionally, input data 130 may be received at a predetermined frequency. For another example, terminal equipment 110 may process input data 130 first and send input data 130 to server equipment 120 when detecting a change of input data 130. In this way, the bandwidth requirement for transmitting of input data 130 may be reduced, and extra overhead of terminal equipment 110 and server equipment 120 for transmitting and receiving input data 130 may be reduced.

According to the example implementation of the present disclosure, an updating process may be started at a predetermined time interval. According to the example implementation of the present disclosure, the updating process may be started in response to an update request used for updating the AI application. Through the example implementation of the present disclosure, the latest full version may be generated continuously at server equipment 120 so as to facilitate updating of the lite version at terminal equipment 110.

The first version of the AI application is updated with input data 130 to generate the second version of the AI application at block 320. Here, the first version of the AI application is deployed at the server equipment. For example, the first version may be a full version of AI application 210 as illustrated in FIG. 2.

Figure 4:
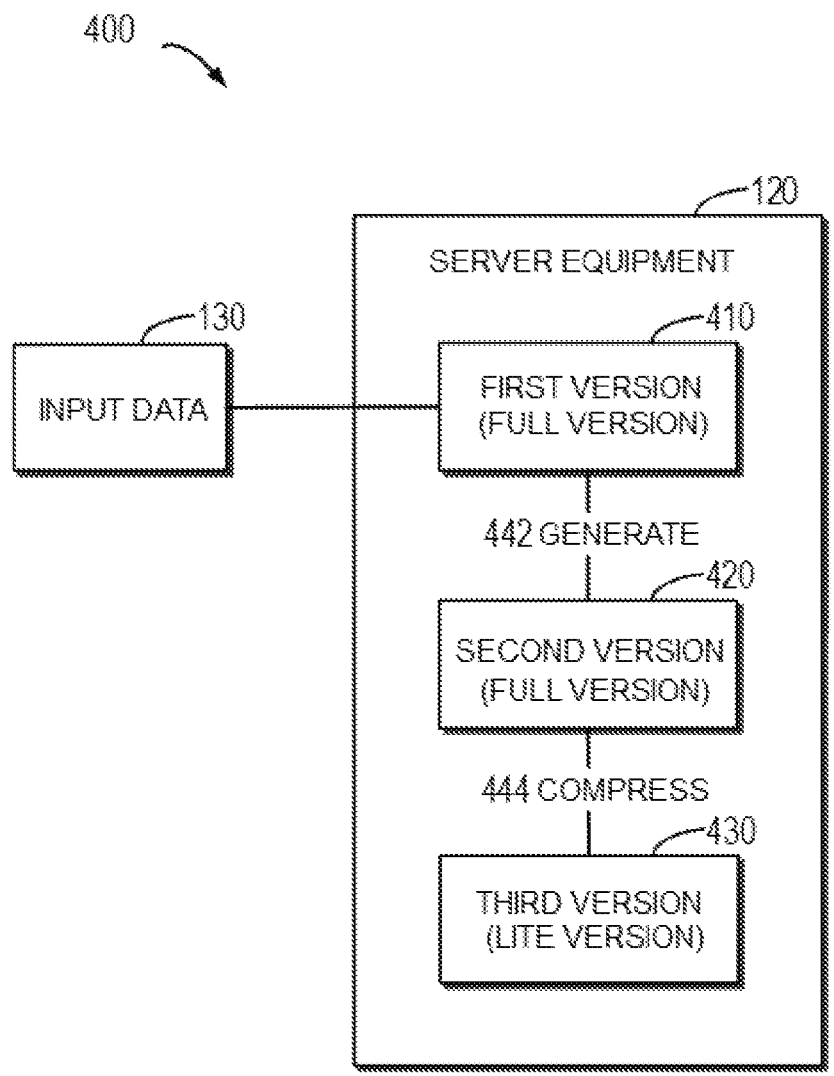
FIG. 4 schematically illustrates a block diagram of a process of managing an AI application at server equipment according to an example implementation of the present disclosure.

Hereinafter, how to manage respective versions of the AI application will be described with reference to FIG. 4. FIG. 4 schematically illustrates block diagram 400 of a process of managing an AI application at server equipment 120 according to an example implementation of the present disclosure. Here, the AI application may be a pedometer application, and first version 410 and second version 420 may be full versions. Specifically, first version 410 may be trained with input data 130 to generate second version 420 (step 442). Through the example implementation of the present disclosure, first version 410 at server equipment 120 may be trained continuously by newly received input data 130. In this way, the full version at server equipment 120 may be made to be more suitable for processing newly received input data 130.

According to the example implementation of the present disclosure, a triggering condition may be set for the above training process. Specifically, a change of input data 130 may be detected. If the change of input data 130 is determined to be greater than a predetermined threshold, then the training process is started. In the example of the pedometer application, if input data 130 indicates that the user turns from a walking state into a running state, then the training process may be started. According to the example implementation of the present disclosure, the AI application may be updated based on various training techniques which have been developed at present and/or will be developed in the future. Second version 420 of the AI application may be acquired by training first version 410 of the AI application with input data 130.

It will be understood that second version 420 may not be directly deployed at terminal equipment 110 due to limitations by computing power and storage capacity of terminal equipment 110. At block 330 of FIG. 3, second version 420 of the AI application is compressed to generate third version 430 of the AI application (step 444). Third version 430 here is a lite version of the AI application. According to the example implementation of the present disclosure, the second version may be compressed to third version 430 by multiple means (step 444). It will be understood that second version 420 is a full version, and accordingly may occupy a larger storage space and more computational resources. In order to generate a lite version suitable to be deployed at terminal equipment 110, redundant parameters in second version 420 of the AI application may be deleted. For example, intermediate data irrelevant to a final output result in second version 420, may be deleted, and the like.

According to the example implementation of the present disclosure, redundant branches in second version 420 of the AI application may be cut out. It will be understood that second version 420 may include branches used for processing certain abnormal conditions. In consideration of limitations in storage capacity and computing power of the terminal equipment, the redundant branches used rarely may be removed, so as to reduce storage space and computation quantity required by third version 430.

According to the example implementation of the present disclosure, processing of the AI application may be simplified according to a format of input data 130. It will be understood that the full version of the AI application may be suitable for processing complicated input data including various signals. For example, the full version may process data of global positioning signals, data of an accelerator, data of a gyroscope, data of a geomagnetic sensor, etc. However, terminal equipment 110 may be provided with no geomagnetic sensor, the part associated with processing of geomagnetic data in the full version is invalid at this point, and accordingly the function of the part may be removed.

According to the example implementation of the present disclosure, the precision of parameters in second version 420 of the AI application may be reduced. For example, it is assumed that in the training process at server equipment 120, all parameters are represented in 32 bits. Because terminal equipment 110 only has a low processing capacity and a small storage space, the parameters in the AI application may be represented in 16 bits or other low precision.

Through the example implementation of the present disclosure, while the precision of the AI application may be reduced at the moment, third version 430 compressed has been converted into the lite version suitable to be deployed onto terminal equipment 110. For example, the size of the AI application may be reduced to several megabytes from hundreds of megabytes so as to be adaptable to storage capacity and processing capacity of terminal equipment 110.

At block 340, third version 430 of the AI application may be deployed to terminal equipment 110 to replace the fourth version of the AI application deployed at the terminal equipment. It will be understood that the fourth version of the AI application is the AI application, for processing the input data received by the terminal equipment, deployed in terminal equipment 110 originally (e.g., the lite version of AI application 220, as illustrated in FIG. 2). Through the example implementation of the present disclosure, third version 430 is the lite version acquired by training based on the latest received input data 130. Accuracy of the process of processing input data 130 may be improved by replacing an outdated version, which cannot provide accurate output, in terminal equipment 110 with the lite version.

It will be understood that the training process will take a certain amount of time. In the training process, first version 410 at server equipment 120 may be used for processing input data 130 to avoid interruption of processing of data. Although first version 410 may not output a result that is completely correct at the moment, first version 410 has higher accuracy and is suitable for processing more diversified input data, in comparison with performance of the fourth version at terminal equipment 110. Further, a result obtained at server equipment 120 may be sent to terminal equipment 110 to solve the problem of the low accuracy of the fourth version.

According to the example implementation of the present disclosure, currently latest second version 420 may be acquired continuously along with performing of the training process. At this time, input data 130 may be processed with second version 420. With the advance of the training process, the full version acquired by training will be increasingly suitable for processing input data 130. Processing results may be sent to terminal equipment 110 continuously.

Figure 5:
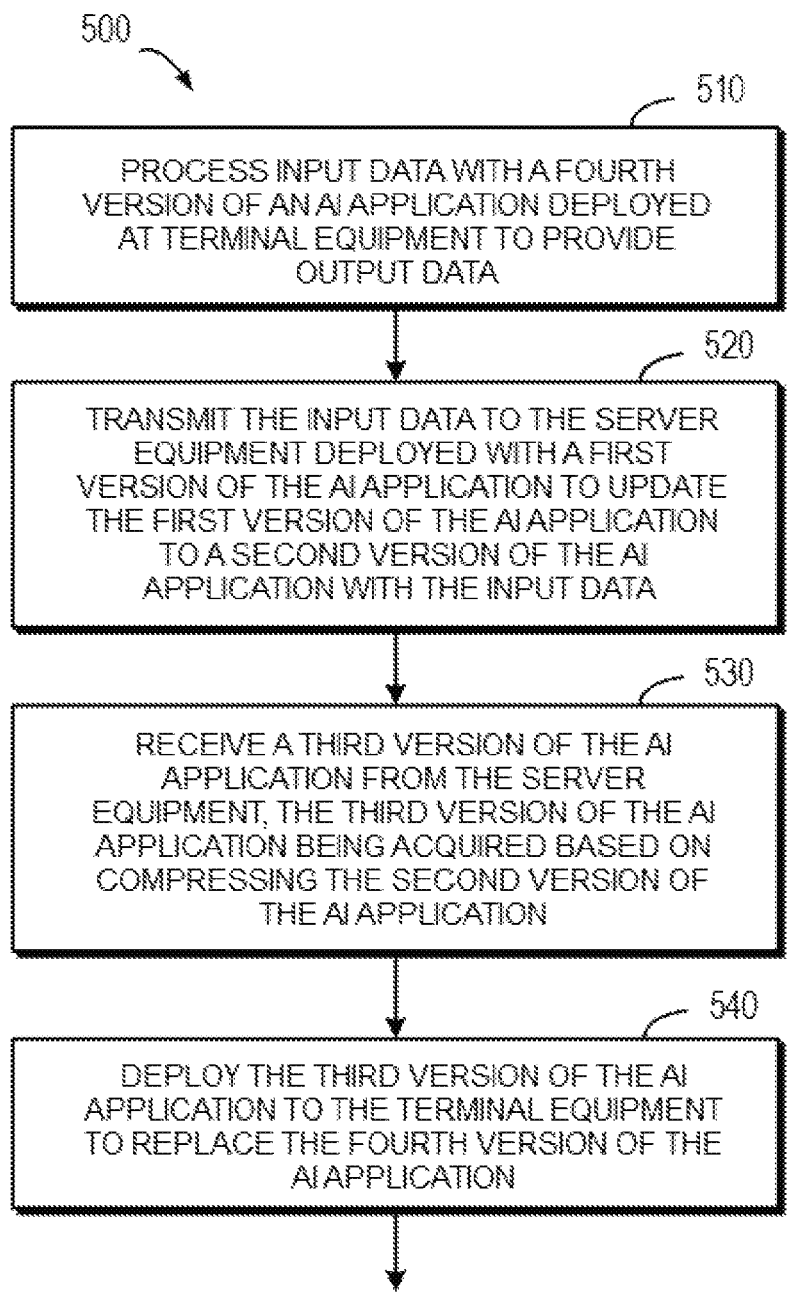
FIG. 5 schematically illustrates a flow chart of a method for managing an AI application according to an example implementation of the present disclosure.

Since the processes executed at server equipment 120 have been described above with reference to FIGS. 3 and 4, the process executed at terminal equipment 110 will be described with reference to FIG. 5 hereinafter. FIG. 5 schematically illustrates a flow chart of method 500 for managing an AI application according to an example implementation of the present disclosure. According to the example implementation of the present disclosure, method 500 may be executed at terminal equipment 110. At block 510, input data 130 are processed with the fourth version of the AI application deployed at terminal equipment 110 to provide output data. The fourth version here may be, for example, a lite version of the pedometer application used for processing sports data.

According to the example implementation of the present disclosure, a change of input data 130 may be detected. If the change of input data 130 is determined to be lower than a predetermined threshold, it means that the fourth version may continue to be used. At this time, input data 130 may be processed with the fourth version of the AI application. If the change of input data 130 is greater than the predetermined threshold, it means that the fourth version is no longer suitable for processing current input data 130, and the updating process may be started.

At block 520, input data 130 is transmitted to server equipment 120 deployed with the first version of the AI application, so as to update first version 410 of the AI application to second version 420 of the AI application with input data 130. Specifically, server equipment 120 may execute the updating process based on method 300 described above. Relevant details will not be repeated here.

According to the example implementation of the present disclosure, when the change of input data 130 is found to be greater than the predetermined threshold, input data 130 may be sent to server equipment 120 to start the updating process. According to an example implementation of the present disclosure, the updating process may be started at a predetermined time interval. According to the example implementation of the present disclosure, the updating process may be started in response to an update request used for updating the AI application. Through the example implementation of the present disclosure, the lite version at terminal equipment 110 may be updated continuously, so that the lite version may be more suitable for processing input data 130.

After third version 430 has been acquired, third version 430 of the AI application is received from server equipment 120 at block 530, and third version 430 of the AI application is acquired based on compressing second version 420 of the AI application. At block 540, third version 430 of the AI application is deployed to terminal equipment 110 to replace the fourth version of the AI application.

According to the example implementation of the present disclosure, since input data 130 changes excessively, the original lite version at terminal equipment 110 cannot acquire accurate output data anymore. At this time, input data 130 may be processed by the full version at server equipment 120. Although updating of the full version is not completed yet at the moment, the full version may process more complicated input data in comparison with the lite version at terminal equipment 110, and accordingly, accuracy of the output data may be higher than that of the output data acquired at terminal equipment 110. Terminal equipment 110 may receive the output data from server equipment 120. According to the example implementation of the present disclosure, which versions at server equipment 120 are used for acquiring the output data is not limited, and the output data may be acquired by processing input data 130 with first version 410 or second version 420 of the AI application.

Figure 6:
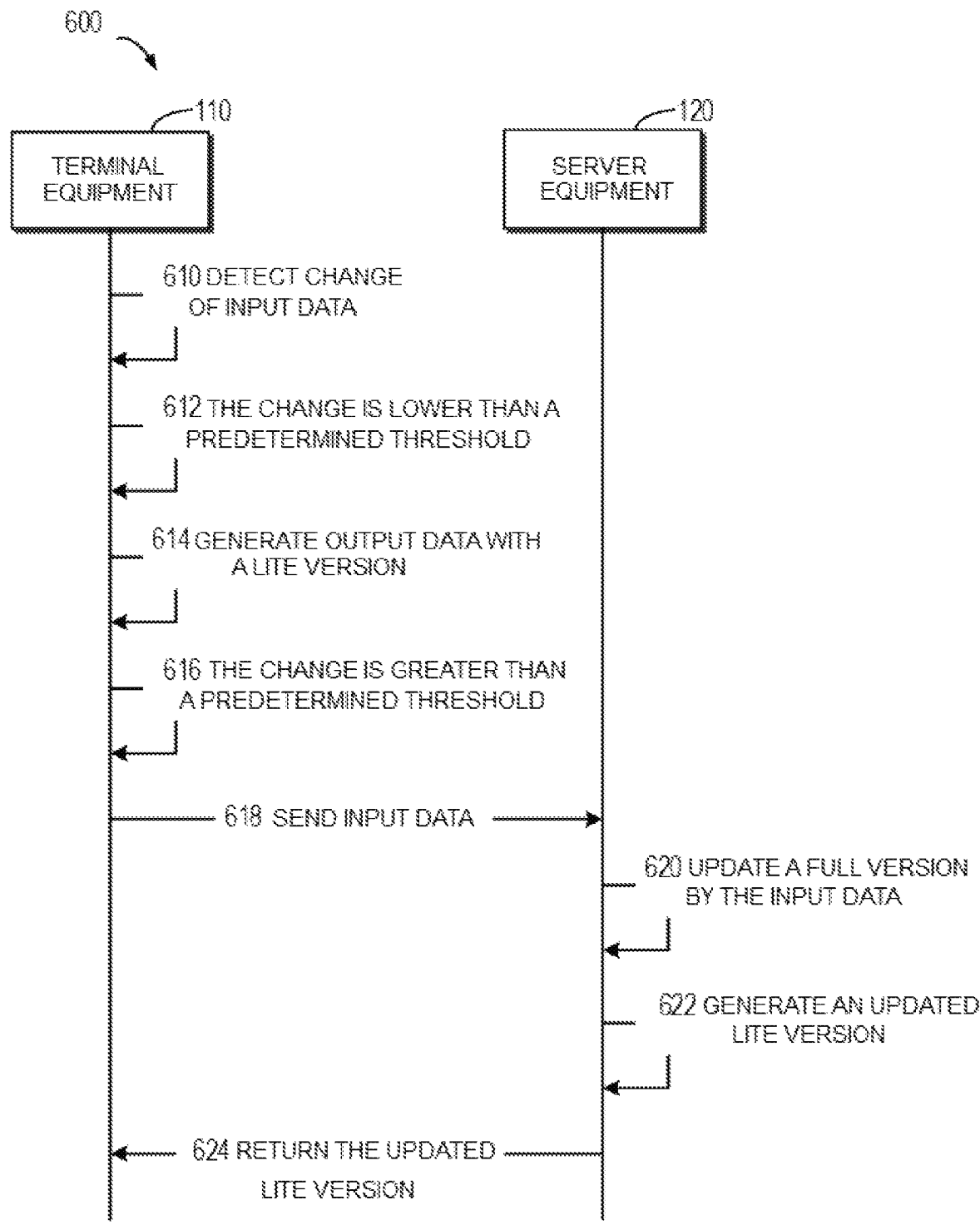
FIG. 6 schematically illustrates a block diagram of an interactive process between terminal equipment and server equipment according to an example implementation of the present disclosure.

FIG. 6 schematically illustrates block diagram 600 of an interactive process between terminal equipment 110 and server equipment 120 according to an example implementation of the present disclosure. As illustrated in FIG. 6, terminal equipment 110 may detect a change of input data (step 610). If the change of the input data is determined to be lower than a predetermined threshold (step 612), then terminal equipment 110 processes the input data with a local lite version, so as to generate output data (step 614). If the change of the input data is determined to be greater than the predetermined threshold (step 616), then terminal equipment 110 transmits input data to server equipment 120 (step 618). Server equipment 120 receives the input data and updates a local full version with the input data received (step 620). Then, server equipment 120 generates an updated lite version (step 622) and returns the updated lite version to terminal equipment 110 (step 624).

Figure 7:
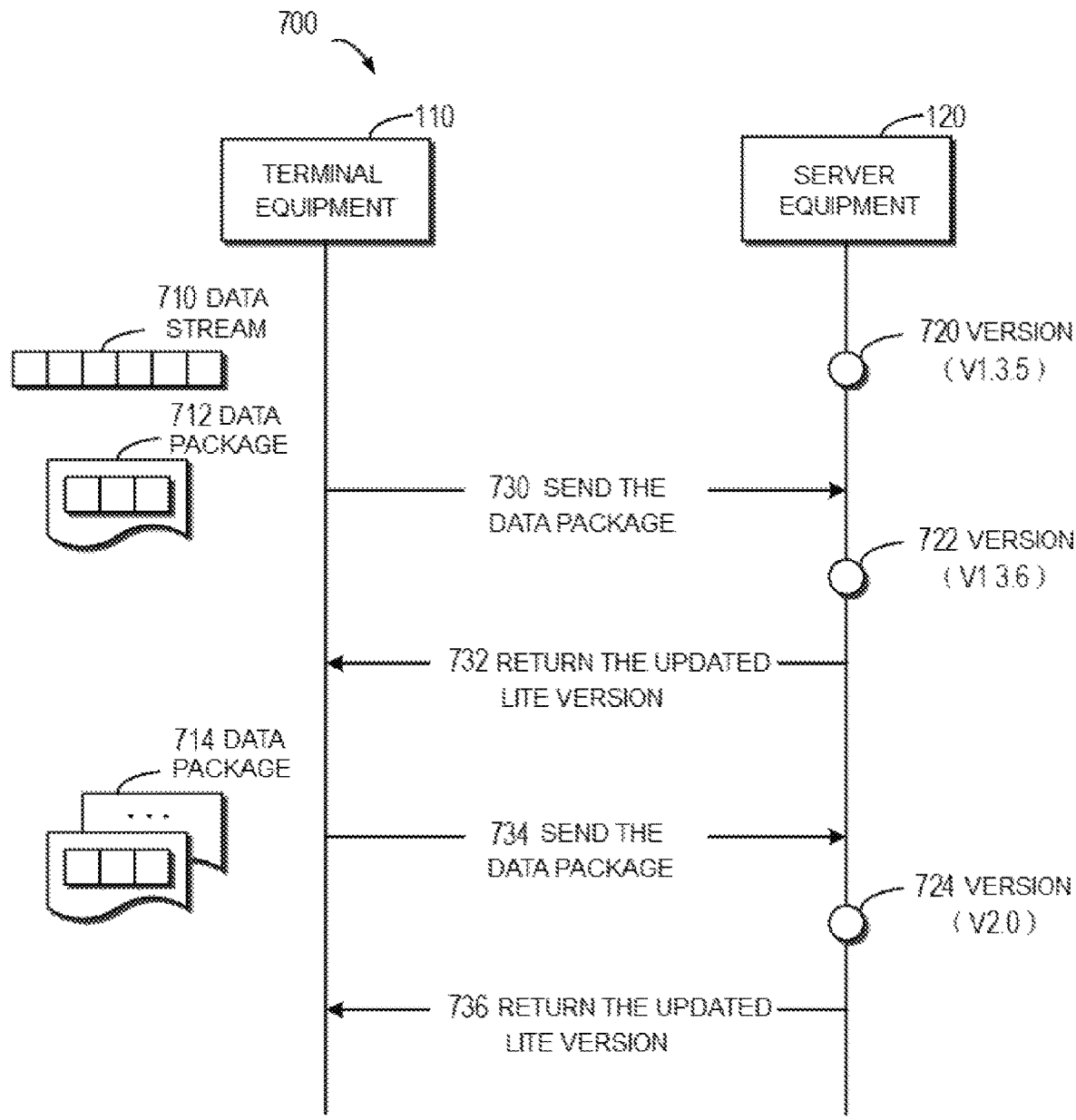
FIG. 7 schematically illustrates a block diagram of a process of generating an AI application in different versions according to an example implementation of the present disclosure.

The specific steps associated with the starting of the updating process have been described above. According to an updating degree of the AI application, the updating process may be divided into two types: online updating and full updating. More details associated with version updating will be described with reference to FIG. 7 hereinafter. FIG. 7 schematically illustrates block diagram 700 of a process of generating an AI application in different versions according to an example implementation of the present disclosure. As illustrated in FIG. 7, input data may form data stream 710 continuously at terminal equipment 110. In the example of the pedometer application, data stream 710 primarily includes walking data of a user, and may also include a small amount of running data. Terminal equipment 110 may monitor a change of respective input data in data stream 710, and package data (e.g., running data) having great changes into data package 712.

Terminal equipment 110 may transmit the data package to server equipment 120 (step 730). Assuming that there is version 720 (with version number V1.3.5) at server equipment 120, server equipment 120 may update version 720 to version 722 (i.e., with version number V1.3.6) with data package 712 received. The updating herein merely relates to small-size training, and accordingly, it may be considered that the updating merely relates to online updating of versions, and does not relate to retraining of a machine learning model. Server equipment 120 may generate a lite version corresponding to version 722 and return the lite version to terminal equipment 110 (step 732).

Then, terminal equipment 110 may process the input data with the updated lite version received. If the input data changes severely, e.g., when the user turns to running from walking, terminal equipment 110 may package data associated with running into data package 714, and send data package 714 to server equipment 120 (step 734). Server equipment 120 may retrain the machine learning model according to data package 714 received, and accordingly, version 724 (with version number V2.0) may be acquired after the full updating. Further, server equipment 120 may generate a lite version corresponding to version 724, and return the lite version to terminal equipment 110 (step 736).

Through the example implementation of the present disclosure, the AI application at terminal equipment 110 may be updated to a relatively small extent, and may also be updated to a relatively great extent. When server equipment 120 executes the updating process, terminal equipment 110 may continue to adopt the original AI application to process the input data. In this way, continuous operation of terminal equipment 110, as well as seamless transition of all the versions, may be ensured.

The example of starting the updating process based on the change of input data 130 has been described above. According to the example implementation of the present disclosure, whether to start the updating process may be determined based on a difference between output data of the lite version and output data of the full version. Assuming that a step length of the user, determined based on the lite version, is 0.8 m, while a step length of the user, determined based on the full version, is 1 m, the difference between them, namely, 1-0.8=0.2 m, exceeds a threshold proportion (e.g., 10%), then it may be considered at the moment that the lite version at terminal equipment 110 is no longer suitable for processing input data 130, and the updating process should be started.

Figure 8:
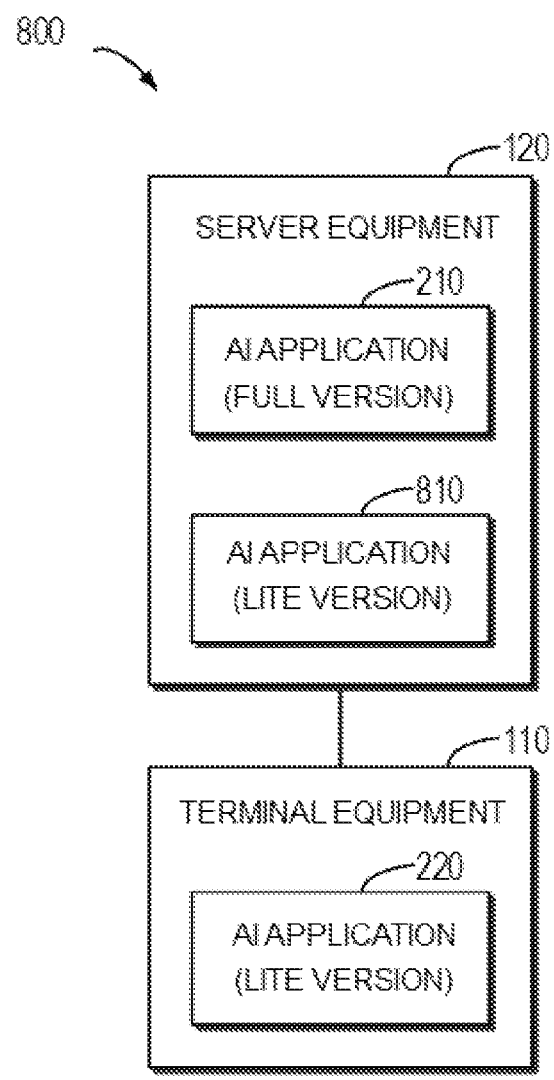
FIG. 8 schematically illustrates a block diagram of a process of managing an AI application based on double versions according to an example implementation of the present disclosure.

FIG. 8 schematically illustrates block diagram 800 of a process of managing an AI application based on double versions according to an example implementation of the present disclosure. As illustrated in FIG. 8, in order to monitor performance of AI application 220 at terminal equipment 110 more effectively, AI application 810 that is the same as AI application 220 may be deployed at server equipment 120. Then, two identical lite versions are operated at server equipment 120 and terminal equipment 110 respectively. Performance of AI application 220 may be determined based on output data of AI application 810. Through the example implementation of the present disclosure, various operation states of the AI application at terminal equipment 110 may be acquired directly at server equipment 120. On the one hand, the transmission bandwidth requirement between server equipment 120 and terminal equipment 110 may be reduced, and on the other hand, the delay caused by transmission may be avoided, and thus, the monitoring efficiency may be improved.

According to the example implementation of the present disclosure, AI applications 810 and 210 at server equipment 120 may be used for processing input data 130 respectively to acquire output data. If it is found that a difference between the two pieces of output data is greater than a predetermined threshold, then the updating process described above may be started. Through the example implementation of the present disclosure, the updating process of terminal equipment 110 may be managed at server equipment 120. In this way, AI application 220 at terminal equipment 110 may be updated automatically on a condition without interfering with normal operation of terminal equipment 110.

According to the example implementation of the present disclosure, terminal equipment 110 and server equipment 120 may constitute an application system. At the moment, terminal equipment 110 may be operated at an edge side of the application system, while server equipment 120 may be operated at a cloud side of the application system. Through the example implementation of the present disclosure, AI applications providing edge computing may be managed in a simple and effective manner, so that the processing capability of the whole application system may be improved.

Examples of the methods according to the present disclosure have been described above in detail with reference to FIGS. 2-8, and the implementing of corresponding apparatuses will be described hereinafter. According to the example implementation of the present disclosure, an apparatus for managing an AI application is provided. The apparatus may be implemented at the server equipment and includes a receiving module configured to receive input data to be processed by the AI application; an updating module configured to update a first version of the AI application with the input data so as to generate a second version of the AI application, wherein the first version of the AI application is deployed at server equipment; a compressing module configured to compress the second version of the AI application to generate a third version of the AI application; and a deploying module configured to deploy the third version of the AI application to the terminal equipment so as to replace a fourth version of the AI application deployed at the terminal equipment, wherein the fourth version of the AI application is used for processing the input data received at the terminal equipment.

According to the example implementation of the present disclosure, an apparatus for managing an AI application is provided. The apparatus may be implemented at terminal equipment and includes a processing module configured to process input data with a fourth version of the AI application deployed at the terminal equipment, to provide output data; a transmission module configured to transmit the input data to server equipment deployed with a first version of the AI application, so as to update the first version of the AI application with the input data to a second version of the AI application; a receiving module configured to receive a third version of the AI application from the server equipment, wherein the third version of the AI application is acquired based on compressing the second version of the AI application; and a deploying module configured to deploy the third version of the AI application to the terminal equipment so as to replace a fourth version of the AI application. According to the example implementation of the present disclosure, the apparatus further includes modules used for executing other steps of the method described above.

It will be understood that the technical solution for managing an AI application is described by merely taking the pedometer application as the example above. According to the example implementation of the present disclosure, the AI application may be, for example, an application for executing image processing. An application for processing pictures taken in the daytime may be deployed on the terminal equipment such as a smart phone. Assuming that the user begins to take a picture at night, at this time, input data changes, and the process for updating the AI application, as described above, may be started.

Figure 9:
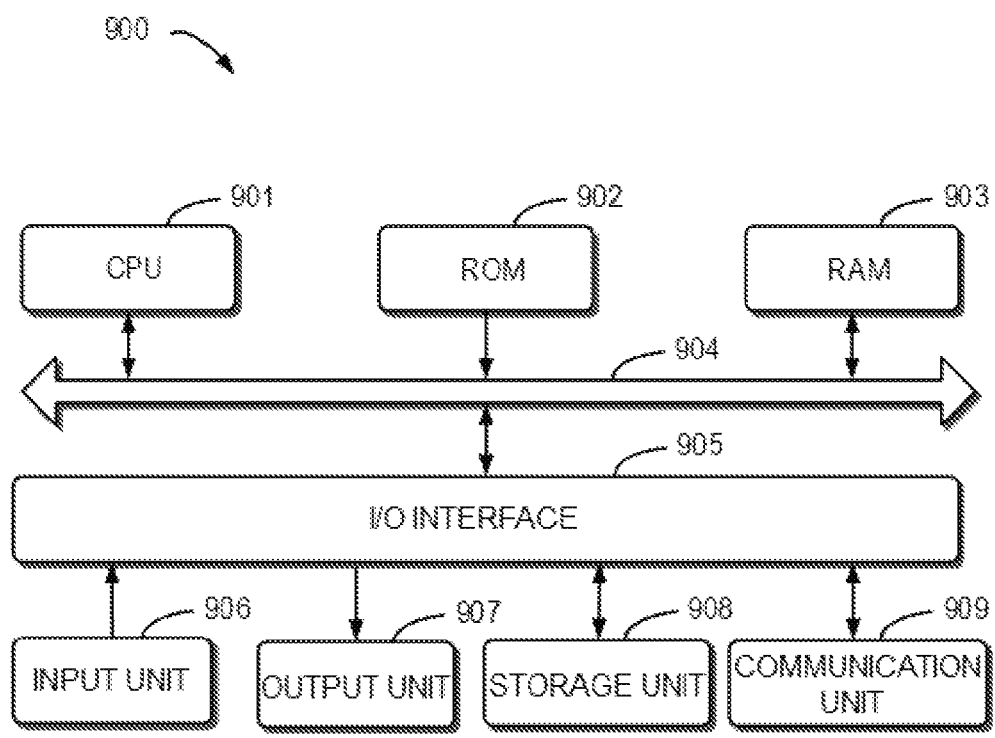
FIG. 9 schematically illustrates a block diagram of a device for managing an AI application according to an example implementation of the present disclosure.

FIG. 9 schematically illustrates a block diagram of device 900 for managing an AI application according to an example implementation of the present disclosure. As illustrated in the figure, device 900 includes central processing unit (CPU) 901, which may execute various moderate actions and processing according computer program instructions stored in read only memory (ROM) 902 or computer program instructions loaded to random access memory (RAM) 903 from storage unit 908. Various programs and data, required by the operation of device 900, may also be stored in RAM 903. CPU 901, ROM 902, and RAM 903 are connected to one another through bus 904. Input/output (I/O) interface 905 is also connected to bus 904.

A plurality of members of device 900 are connected to I/O interface 905, and include input unit 906, e.g., a keyboard, a mouse, etc.; output unit 907, e.g., different types of displays, loudspeakers, etc.; storage unit 908, e.g., a disk, a compact disc, etc.; and communication unit 909, e.g., a network card, a modulator-demodulator, a wireless communication transceiver, etc. Communication unit 909 allows device 900 to exchange information/data with other devices through a computer network such as the Internet and/or various telecommunication networks.

Various processes and processing described above, e.g., methods 300 and 500, may be executed by CPU 901. For example, in some implementations, methods 300 and 500 may be implemented as computer software programs which are tangibly contained in a machine readable medium, e.g., storage unit 908. In some implementations, part or total of the computer programs may be loaded in and/or installed to device 900 through ROM 902 and/or communication unit 909. When the computer programs are loaded to RAM 903 and executed by CPU 901, one or more steps of methods 300 and 500 described above may be executed. Alternatively, in other implementations, CPU 901 may also be configured in any other appropriate manner so as to implement the above processes/methods.

According to the example implementation of the present disclosure, an electronic device is provided, including at least one processor; a volatile memory; and a memory coupled with the at least one processor, wherein the memory has instructions stored therein, and the instructions, when executed by the at least one processor, cause the device to execute an action for managing an AI application. The action includes: receiving input data to be processed by the AI application; updating a first version of the AI application with the input data to generate a second version of the AI application, wherein the first version of the AI application is deployed at server equipment; compressing the second version of the AI application to generate a third version of the AI application; and deploying the third version of the AI application to terminal equipment to replace a fourth version of the AI application deployed at the terminal equipment, wherein the fourth version of the AI application is used for processing the input data received at the terminal equipment.

According to the example implementation of the present disclosure, the generating of the second version of the AI application includes: updating the first version of the AI application with the input data to generate the second version of the AI application, in response to at least any of the following: change of the input data being greater than a predetermined threshold; reaching a predetermined time interval; and an update request for updating the AI application.

According to the example implementation of the present disclosure, the generating of the second version of the AI application includes: training the first version of the AI application with the input data, so as to acquire the second version of the AI application.

According to the example implementation of the present disclosure, the generating of the third version of the AI application includes at least one of the following: deleting redundant parameters in the second version of the AI application; cutting out redundant branches in the second version of the AI application; and reducing precision of parameters in the second version of the AI application.

According to the example implementation of the present disclosure, the action further includes: deploying the third version of the AI application at the server equipment; processing the input data with the third version of the AI application so as to acquire output data; and determining performance of the fourth version of the AI application based on the output data.

According to the example implementation of the present disclosure, the action further includes: processing the input data with the second version of the AI application to acquire output data; and sending the output data to the terminal equipment.

According to the example implementation of the present disclosure, the action is implemented at the server equipment.

According to the example implementation of the present disclosure, the first version and the second version of the AI application are full versions of the AI application, and the third version and the fourth version of the AI application are lite versions of the AI application.

According to the example implementation of the present disclosure, an electronic device is provided, including at least one processor; a volatile memory, and a memory coupled with the at least one processor, wherein the memory has instructions stored therein, and the instructions, when executed by the at least one processor, cause the device to execute an action for managing the AI application. The action includes: processing input data with the fourth version of the AI application deployed at the terminal equipment to provide output data; transmitting the input data to the server equipment deployed with the first version of the AI application, so as to update the first version of the AI application to the second version of the AI application with the input data; receiving the third version of the AI application from the server equipment, wherein the third version of the AI application is acquired based on compressing the second version of the AI application; and deploying the third version of the AI application to the terminal equipment to replace the fourth version of the AI application.

According to the example implementation of the present disclosure, the processing of the input data by the fourth version of the AI application includes: detecting a change of the input data; and processing the input data with the fourth version of the AI application according to a determination that the change of the input data is lower than a predetermined threshold.

According to the example implementation of the present disclosure, the transmitting of the input data to the sever equipment includes: transmitting the input data to the server equipment in response to at least any of the following: a change of the input data being greater than the predetermined threshold; reaching a predetermined time interval; and an update request for updating the AI application.

According to the example implementation of the present disclosure, the action further includes: receiving the output data from the server equipment, wherein the output data are acquired by processing the input data with the second version of the AI application.

According to the example implementation of the present disclosure, the action is implemented at the terminal equipment.

According to the example implementation of the present disclosure, the first version and the second version of the AI application are full versions of the AI application, and the third version and the fourth version of the AI application are lite versions of the AI application.

According to the example implementation of the present disclosure, a computer program product is provided. The computer program product is tangibly stored on a non-transitory computer-readable medium and includes machine executable instructions which are used for executing the method according to the present disclosure.

According to the example implementation of the present disclosure, a computer-readable medium is provided. Machine executable instructions are stored on the computer-readable medium. When executed by at least one processor, the machine executable instructions cause the at least one processor to implement the method according to the present disclosure.

Illustrative embodiments of the present disclosure include a method, a device, a system, and/or a computer program product. The computer program product may include a computer-readable storage medium, on which computer-readable program instructions used for executing various aspects of the present disclosure are loaded.

The computer-readable storage medium may be a tangible device capable of retaining and storing instructions used by an instruction-executing device. For example, the computer-readable storage medium may be, but is not limited to, an electric storage device, a magnetic storage device, an optical storage device, an electromagnetic storage device, a semiconductor storage device, or any suitable combination of the foregoing. More specific examples (a non-exhaustive list) of the computer-readable storage medium include: a portable computer disk, a hard disk, a RAM, a ROM, an erasable programmable read-only memory (EPROM or flash memory), a static random access memory (SRAM), a portable compact disk read-only memory (CD-ROM), a digital versatile disk (DVD), a memory stick, a floppy disk, a mechanical coding device such as a punch card or protrusions in a groove on which instructions are stored, and any appropriate combination of the above. The computer-readable storage medium used here is not construed as transient signals per se, such as radio waves or other freely propagating electromagnetic waves, electromagnetic waves propagating through waveguides or other transfer media (for example, optical pulses through fiber-optic cables), or electrical signals transmitted through electrical wires.

The computer-readable program instructions described herein may be downloaded from a computer-readable storage medium to various computing/processing devices, or downloaded to an external computer or external storage device via a network such as the Internet, a local area network, a wide area network, and/or a wireless network. The network may include copper transmission cables, optical fiber transmission, wireless transmission, routers, firewalls, switches, gateway computers, and/or edge servers. The computer-readable program instructions are received by a network adapter card or network interface of each computing/processing device from the network, and are forwarded to be stored in the computer-readable storage medium of each computing/processing device.

Computer program instructions for performing the operations of the present disclosure may be assembly instructions, instruction set architecture (ISA) instructions, machine instructions, machine-related instructions, microcode, firmware instructions, state setting data, or source code or object code written in any combination of one or more programming languages, wherein the programming languages include object-oriented programming languages, such as Smalltalk and C++, and conventional procedural programming languages, such as the "C" language or similar programming languages. The computer-readable program instructions may be completely executed on a user's computer, partially executed on a user's computer, executed as a separate software package, partially executed on a user's computer and partially executed on a remote computer, or completely executed on a remote computer or a server. In cases where a remote computer is involved, the remote computer may be connected to a user's computer over any kind of networks, including a local area network (LAN) or a wide area network (WAN), or may be connected to an external computer (e.g., over the Internet by using an Internet service provider). In some implementations, an electronic circuit, for example, a programmable logic circuit, a field programmable gate array (FPGA), or a programmable logic array (PLA), is personalized by utilizing state information of computer-readable program instructions, and the electronic circuit may execute the computer-readable program instructions so as to implement various aspects of the present disclosure.

Various aspects of the present disclosure are described herein with reference to flow charts and/or block diagrams of the method, the apparatus (system), and the computer program product according to implementations of the present disclosure. It should be understood that each block of the flow chart and/or block diagrams and combinations of blocks in the flow charts and/or block diagrams may be implemented by the computer-readable program instructions.

The computer-readable program instructions may be provided to a processing unit of a general-purpose computer, a special-purpose computer, or another programmable data processing apparatus, thereby producing a machine, such that these instructions, when executed by the processing unit of the computer or another programmable data processing apparatus, produce a means for implementing the functions/actions specified in one or more blocks in the flow charts and/or block diagrams. The computer-readable program instructions may also be stored in the computer-readable storage medium, and the instructions cause a computer, a programmable data processing apparatus, and/or other devices to work in a specific manner, such that the computer-readable medium having instructions stored includes an article of manufacture that includes instructions for implementing various aspects of the functions/actions specified in one or more blocks in the flow charts and/or block diagrams.

The computer-readable program instructions may also be loaded onto computers, other programmable data processing apparatus, or other devices, so that a series of operating steps may be executed on the computers, other programmable data processing apparatus, or other devices to produce a computer-implemented process. Therefore, the instructions executed on the computer, other programmable data processing apparatus, or other devices implement the functions/actions specified in one or more blocks in the flow charts and/or block diagrams.

The flow charts and block diagrams in the accompanying drawings show the architectures, functions, and operations of possible implementations of systems, methods, and computer program products according to multiple implementations of the present disclosure. In this regard, each block in the flow chart or block diagrams may represent a module, a program segment, or a part of an instruction that contains one or more executable instructions for implementing specified logical functions. In some alternative implementations, functions indicated in the blocks may also occur in an order different from that indicated in the accompanying drawings. For example, two successive blocks may actually be executed in parallel substantially, or they may be executed in an opposite order sometimes, depending on the functions involved. It should also be noted that each block in the block diagrams and/or flow charts and a combination of blocks in the block diagrams and/or flow charts may be implemented by a dedicated hardware-based system for executing specified functions or actions, or may be implemented by a combination of dedicated hardware and computer instructions.

Various implementations of the present disclosure have been described above. The above description is illustrative but not exhaustive, and is not limited to the various implementations disclosed. Many modifications and variations will be apparent to those of ordinary skill in the art without departing from the scope and spirit of the illustrated various implementations. The selection of terms as used herein is intended to best explain principles and practical applications of the various implementations or improvements to technologies on the market, and to otherwise enable persons of ordinary skill in the art to understand the implementations disclosed herein.

What is claimed is:

1. A method for managing an artificial intelligence (AI) application, comprising:
 collecting, at terminal equipment, input data to be processed by the AI application;
 updating a first version of the AI application with the input data to generate a second version of the AI application, the first version of the AI application being deployed at server equipment associated with the terminal equipment;
 compressing the second version of the AI application to generate a third version of the AI application; and
 deploying the third version of the AI application to the terminal equipment to replace a fourth version of the AI application at the terminal equipment;
 wherein updating the first version of the AI application with the input data comprises:
  in response at least in part to a detected change of the input data collected at the terminal equipment, relative to previous input data utilized in previous training of the AI application, being greater than a predetermined threshold, updating the first version of the AI application by training the first version of the AI application, utilizing at least portions of the input data, to generate the second version of the AI application; and
 wherein at least the first version of the AI application is a full version of the AI application deployed at the server equipment and at least the third version of the AI application deployed at the terminal equipment is a reduced version of the AI application, relative to the full version of the AI application deployed at the server equipment.

2. The method according to claim 1, wherein updating the first version of the AI application with the input data to generate the second version of the AI application, is further performed in response to at least in part any of the following:
 reaching a predetermined time interval; and
 an update request for updating the AI application.

3. The method according to claim 1, wherein the generating of the second version of the AI application comprises:
 training the first version of the AI application with the input data to acquire the second version of the AI application.

4. The method according to claim 1, wherein the generating of the third version of the AI application comprises at least any of the following:
 deleting redundant parameters in the second version of the AI application;
 cutting out redundant branches in the second version of the AI application; and
 reducing precision of parameters in the second version of the AI application.

5. The method according to claim 1, further comprising:
 deploying the third version of the AI application at the server equipment;
 processing the input data with the third version of the AI application to acquire output data; and
 determining performance of the fourth version of the AI application based on the output data.

6. The method according to claim 1, further comprising:
 processing the input data with the second version of the AI application to acquire output data; and
 sending the output data to the terminal equipment.

7. The method according to claim 1, wherein the method is implemented at the server equipment.

8. The method according to claim 1, wherein the second version of the AI application is a full version of the AI application, and the fourth version of the AI application is a reduced version of the AI application relative to the full version of the AI application deployed at the server equipment.

9. The method according to claim 1, comprising:
 processing the input data with the fourth version of the AI application at the terminal equipment in response to the detected change of the input data being lower than the predetermined threshold.

10. The method according to claim 1, wherein the collecting of the input data is performed by one or more sensors at the terminal equipment.

11. A method for managing an AI application, comprising:
 collecting, at terminal equipment, input data;
 transmitting the input data to server equipment deployed with a first version of the AI application to update the first version of the AI application to a second version of the AI application with the input data, the server equipment associated with the terminal equipment;
 receiving a third version of the AI application from the server equipment, the third version of the AI application being acquired based on compressing the second version of the AI application; and
 deploying the third version of the AI application to the terminal equipment to replace a fourth version of the AI application at the terminal equipment;
 wherein transmitting the input data to the server equipment comprises:
  in response at least in part to a detected change of the input data collected at the terminal equipment, relative to previous input data utilized in previous training of the AI application being greater than a predetermined threshold, transmitting the input data to the server equipment to allow the server equipment to update the first version of the AI application by training the first version of the AI application, utilizing at least portions of the input data, to generate the second version of the AI application; and
 wherein at least the first version of the AI application is a full version of the AI application deployed at the server equipment and at least the third version of the AI application deployed at the terminal equipment is a reduced version of the AI application, relative to the full version of the AI application deployed at the server equipment.

12. The method according to claim 11, further comprising:
 in response to a detected change of the input data collected at the terminal equipment, relative to previous input data utilized in previous training of the AI application, being lower than the predetermined threshold, processing the input data with the fourth version of the AI application.

13. The method according to claim 12, wherein the transmitting of the input data to the server equipment comprises: transmitting the input data to the server equipment in response to at least in part any of the following:
 reaching a predetermined time interval; and
 an update request for updating the AI application.

14. The method according to claim 11, further comprising: receiving output data from the server equipment, the output data being acquired by processing the input data with the second version of the AI application.

15. The method according to claim 11, wherein the method is implemented at the terminal equipment.

16. The method according to claim 11, wherein the second version of the AI application is a full version of the AI application, and the fourth version of the AI application is a reduced version of the AI application relative to the full version of the AI application deployed at the server equipment.

17. The method according to claim 11, wherein the collecting of the input data is performed by one or more sensors at the terminal equipment.

18. An electronic device, comprising:
at least one processor;
a volatile memory; and
a memory coupled with the at least one processor, the memory having instructions stored therein, and the instructions, when executed by the at least one processor, causing the electronic device to execute a method for managing an artificial intelligence (AI) application, the method comprising:
collecting, at terminal equipment, input data to be processed by the AI application;
updating a first version of the AI application with the input data to generate a second version of the AI application, the first version of the AI application being deployed at server equipment associated with the terminal equipment;
compressing the second version of the AI application to generate a third version of the AI application; and
deploying the third version of the AI application to the terminal equipment to replace a fourth version of the AI application at the terminal equipment;
wherein updating the first version of the AI application with the input data comprises:
in response at least in part to a detected change of the input data collected at the terminal equipment, relative to previous input data utilized in previous training of the AI application, being greater than a predetermined threshold, updating the first version of the AI application by training the first version of the AI application, utilizing at least portions of the input data, to generate the second version of the AI application; and
wherein at least the first version of the AI application is a full version of the AI application deployed at the server equipment and at least the third version of the AI application deployed at the terminal equipment is a reduced version of the AI application, relative to the full version of the AI application deployed at the server equipment.

19. The electronic device according to claim 18, wherein updating the first version of the AI application with the input data to generate the second version of the AI application, is further performed in response to at least in part any of the following:
reaching a predetermined time interval; and
an update request for updating the AI application.

20. The electronic device according to claim 18, wherein the generating of the second version of the AI application comprises: training the first version of the AI application with the input data to acquire the second version of the AI application.

* * * * *